United States Patent [19]

Dunn et al.

[11] Patent Number: 5,260,596
[45] Date of Patent: Nov. 9, 1993

[54] MONOLITHIC CIRCUIT WITH INTEGRATED BULK STRUCTURE RESONATOR

[75] Inventors: William C. Dunn, Mesa; H. Ming Liaw, Scottsdale; Ljubisa Ristic, Phoenix; Raymond M. Roop, Scottsdale, all of Ariz.

[73] Assignee: Motorola, Inc., Schaumburg, Ill.

[21] Appl. No.: 681,258

[22] Filed: Apr. 8, 1991

[51] Int. Cl.[5] .................. H01L 29/66; H01L 29/96
[52] U.S. Cl. ............................ 257/414; 257/415; 257/416; 257/619
[58] Field of Search ............... 357/25, 26, 27, 40; 310/309, 311, 330, 331, 313 R, 348, 187, 191, 193; 257/415, 416, 420, 414

[56] References Cited

U.S. PATENT DOCUMENTS

| | | | |
|---|---|---|---|
| 4,287,447 | 9/1981 | Skoda et al. | 357/26 |
| 4,320,365 | 3/1982 | Black et al. | 333/187 |
| 4,548,078 | 10/1985 | Bohrer et al. | 357/26 |
| 4,556,812 | 12/1985 | Kline et al. | 310/311 |
| 4,674,319 | 6/1987 | Muller et al. | 357/26 |
| 4,963,954 | 10/1990 | Hälg et al. | 357/26 |
| 5,006,487 | 4/1991 | Stokes | 357/26 |
| 5,019,885 | 5/1991 | Yagawara et al. | 357/25 |
| 5,023,503 | 6/1991 | Legge et al. | 310/311 |

FOREIGN PATENT DOCUMENTS

| | | | |
|---|---|---|---|
| 62-266906 | 11/1987 | Japan | 333/187 |
| 63-82116 | 4/1988 | Japan | 333/187 |
| 63-86610 | 4/1988 | Japan | 333/187 |
| 63-174417 | 7/1988 | Japan | 333/187 |
| 63-175482 | 7/1988 | Japan | 357/25 |
| 2-13109 | 1/1990 | Japan | 333/187 |
| 2-235533 | 3/1991 | United Kingdom | 310/311 |

OTHER PUBLICATIONS

Chen et al., "Integrated Silicon Microbeam PI-FET Accelerometer", IEEE Trans. on Elec. Dec., vol. ED-29, No. 1, Jan. 1982.

Petersen et al., "Micromechanical Accelerometer Integrated with MOS Detection Circuitry", IEEE Trans. on Elec. Dec., vol. ED-29, No. 1, Jan. 1982.

Petersen, "Micromechanical Membrane Switches on Silicon," IBM J. Res. Develop., vol. 23, No. 4, Jul. 1979.

*Primary Examiner*—Rolf Hille
*Assistant Examiner*—Minhloan Tran
*Attorney, Agent, or Firm*—Joe E. Barbee

[57] ABSTRACT

A structure is provided to integrate bulk structure resonators into a monolithic integrated circuit chip. The chip also contains the remaining circuit components (17, 21, 24) required for the desired system function. Micromachining techniques are used to fabricate both support and a cavity (11, 27, 28) which allows mechanical vibration without interference. Alternative embodiments incorporate the use of non-piezoelectric mechanical resonators (14), quartz crystal resonators (18) and thin film piezoelectric resonators (22). Each type of resonator is used for the range of frequencies to which it is suited, providing a family of monolithic resonators capable of being used with integrated circuits having operating frequencies from a few hundred hertz to over 500 Mhz.

5 Claims, 1 Drawing Sheet

MONOLITHIC CIRCUIT WITH INTEGRATED BULK STRUCTURE RESONATOR

BACKGROUND OF THE INVENTION

This invention relates, in general, to resonator devices, and more particularly to monolithic resonators which are integrated with other electronic devices as part of a monolithic integrated circuit.

In the design of radio receivers, particularly paging receivers, cellular radios, and microwave satellite communication systems, it is desirable for components which form the system to take up as little space as possible. It is desirable for as many components as possible to be integrated into a single integrated circuit. This integration also reduces the number of connections needed to make the radio, greatly improving reliability and reducing manufacturing cost.

One problem that is basic to the operation of a high frequency radio, however, is generation of a stable high frequency oscillating electric signal which is used to both transmit and receive information. Another basic problem is the separation of one signal from another by means of resonant filters. Both problems require bulk structure resonators with low signal loss, a very well defined resonance point, and excellent frequency stability. Usually quartz crystals are used to make high frequency resonators. The technology of quartz crystal oscillators limits their ability at extremely high or extremely low frequencies. For frequencies above about 300 Mhz a thin film non-conductive piezoelectric resonator is commonly used, and for frequencies below approximately 100 Khz a non-piezoelectric mechanical resonator is commonly used.

It has been known for some time that certain crystalline materials have piezoelectric properties. Specifically, there is what is called a direct piezoelectric effect, in which electrical charges appear on crystal surfaces upon the application of an external stress. There is also a converse piezoelectric effect, in which the crystal shows strain or deformation when an electrical charge is applied by external means to faces of the crystal. These effects have been used for many years in quartz crystal resonators and other devices in which bulk acoustic waves are transmitted through a crystal, typically between electrode plates at opposite faces of the crystal. These quartz crystal resonators are called bulk resonant devices because the vibration is propagated throughout the bulk of the crystal. Another form of piezoelectric resonator confines the bulk vibration to the surface as an acoustic surface wave induced into a thin film of piezoelectric crystal, and is known as a surface wave device.

Until now however, devices which use an unsupported piezoelectric layer have not been available. Since silicon is not a piezoelectric material, electroacoustic devices could only be made by forming a piezoelectric layer on top of a micromachined silicon structure. Mechanical coupling between the piezoelectric film and a non-piezoelectric material results in damping of the acoustic wave and lowered quality factor (Q) of acoustic wave filters and oscillators. As a result the bulk structure resonators have not been integrated with other components, and so must be coupled to other components on PC boards or hybrid substrates.

Another form of bulk structure resonator uses a physical vibration of a non-piezoelectric structure at a resonant frequency. Typically a non-piezoelectric mechanical resonator of this type is constructed in the same way as a tuning fork or a spring operated pendulum, with a known mass held at the end of a spring and vibration is induced throughout the bulk of the structure by externally applied forces. Techniques are known to micromachine silicon structures to form diaphragms, bridges, and cantilever beams which can then oscillate when a bulk vibration is established in them. These micromachined structures allow higher frequency operation than discrete structures because of the smaller geometries used.

The advantages of monolithic integration are numerous. Compared with a monolithic integrated system, one which requires multiple components will: require more space, be less reliable, have a higher power consumption, and less precise temperature control, have a lower shock tolerance, have greater stocking and spares distribution problems aggravated by the need for high accuracy oscillators to have a matched resonator and oscillator circuit, and will have higher costs at every stage of design and production.

Clearly there is a need for a resonator which can be monolithically integrated with other semiconductor devices, in which the bulk structure resonator is not in contact with anything which would inhibit vibration. This element must be capable of fabrication as a non-piezoelectric mechanical resonator, a quartz crystal resonator and as a piezoelectric film resonator to provide a wide range of operating frequencies.

SUMMARY OF THE INVENTION

Briefly stated, the present invention provides for integration of bulk structure resonators into an integrated circuit chip which also contains the remaining circuit components required to perform a desired function. Surface micromachining techniques are used to fabricate both a support structure and a cavity which can allow mechanical vibration without interference. This allows the generation of a stable frequency source as part of a monolithic integrated circuit with all of the attendant benefits when compared to a discrete system: small size, low cost, high reliability, better spare parts logistics, and ease of closely matching the bulk structure resonator to the oscillator circuit for critical applications. Alternative embodiments incorporate the use of non-piezoelectric mechanical resonators, quartz crystal resonators and thin film non-conductive piezoelectric resonators. Each type of resonator is used for the range of frequencies to which it is suited, providing a family of monolithic resonators capable of being used with integrated circuits having operating frequencies from a few hundred hertz to over 500 Mhz.

DETAILED DESCRIPTION OF THE DRAWINGS

Figure 1:
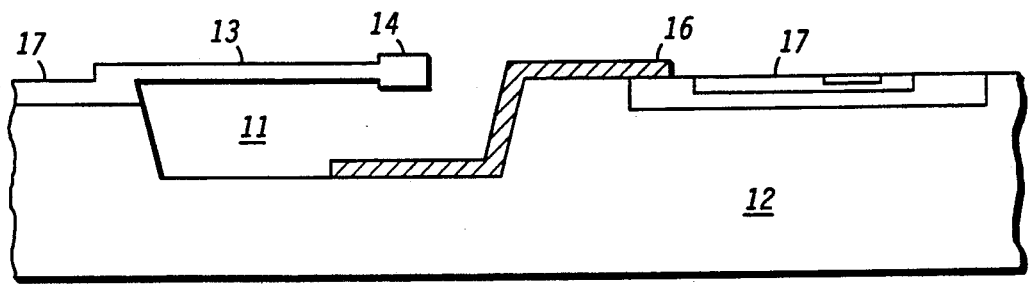
FIG. 1 shows a cross sectional view of an integrated circuit having a mechanical resonator as a first embodiment of the present invention.

FIG. 1 shows a cross sectional view of a portion of an integrated circuit having a non-piezoelectric mechanical resonator as a first preferred embodiment of the present invention. A cavity 11 is etched beneath the surface of a semiconducting substrate 12. The microstructure formed from the top surface is referred to as surface micromachining. Semiconducting substrate 12 is typically fabricated from a material such as silicon or a III-V compound such as gallium-arsenide or the like. The geometry and dimensions of cavity 11 are selected to suit the desired size and support requirements of the non-piezoelectric mechanical resonator. Fabrication comprises, etching of cavity 11 in a semiconducting substrate 12 using photolithographic means well known in the art. Cavity 11 is then filled with a non-silicon material such as a phosphorus silicate glass (PSG) while mechanical elements such as a spring arm 13 and a mass 14 are fabricated by deposition and etching of polycrystalline semiconductor using well known surface micromachining techniques. The PSG material which filled cavity 11 and supported both spring arm 13 and mass 14 during fabrication is etched away leaving the structure shown with cavity 11 providing clearance for mass 14 to vibrate. In this way the bulk structure resonator comprising spring arm 13 and mass 14 becomes an integrated part of semiconducting substrate 12. A plurality of integrated circuit components 17 are also fabricated as part of semiconducting substrate 12. The combination of spring arm 13 and mass 14 will exhibit a predetermined resonant frequency of vibration when excited by some mechanical force. When used for frequencies below approximately 100 Khz, this non-piezoelectric mechanical resonator inherently exhibits a good sensitivity, a very well defined resonance point, and excellent frequency stability when compared with purely electrically resonant devices.

In the embodiment shown, electrostatic forces are used to cause a bulk structure vibration in mass 14 and are derived from a driving circuit (not shown) utilizing some of integrated circuit components 17. A first electrode comprises spring arm 13 and mass 14 by means of conductive doping of the polycrystaline silicon material; a polycrystaline silicon conductor 16 forms a second electrode. Electrostatic forces between these two electrodes will vary according to the relative charge differential between them. The electrodes make a capacitor with a capacitance value which varies as mass 14 vibrates, providing a means to electrically detect the vibration.

Many alternative embodiments are known which also produce a similar electrostatic force acting on mass 14 while using different geometric shapes, and substitution of doped semiconductor material for metal conductors. Other embodiments of this invention use a metal or a metal coated ceramic material for mass 14 and spring arm 13. Yet other embodiments of this invention use some other form of transducer to couple the electrical energy to a mechanical force acting on mass 14. The actual size and shape of spring arm 13 and mass 14 is selected to suit a particular frequency of resonance according to methods well known to those of ordinary skill in the art. For example embodiments of the non-piezoelectric mechanical bulk structure resonator may alternatively be shaped as a pendulum, a vibrating sheet, a bridge structure or a cantilever beam as shown.

Figure 2:
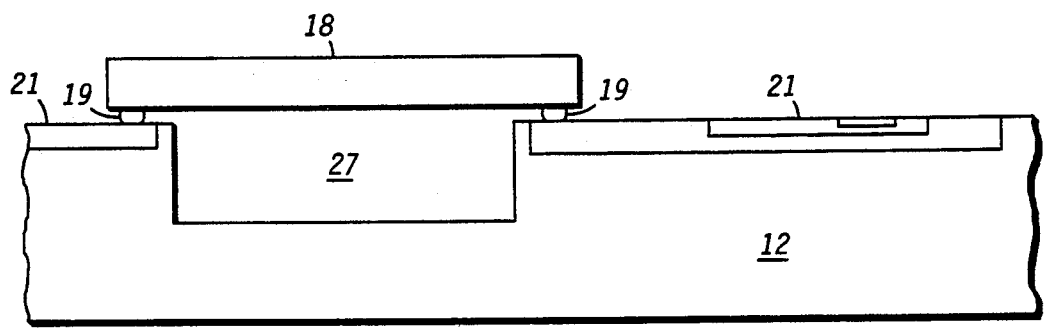
FIG. 2 shows a cross sectional view of an integrated circuit having a quartz crystal resonator as a second embodiment of the present invention.

FIG. 2 shows a cross sectional view of a portion of an integrated circuit having a quartz crystal resonator as a second preferred embodiment of the present invention. Semiconducting substrate 12 is prepared with a plurality of integrated circuit components 21 and a cavity 27. Semiconducting substrate 12 is typically fabricated from a material such as silicon or a III-V compound such as gallium-arsenide. The geometry and dimensions of cavity 27 are selected to suit the size and support requirements of a quartz crystal 18. The actual size, shape and crystal structure of quartz crystal 18 is selected to suit a particular frequency of resonance according to methods well known to those of ordinary skill in the art. By utilizing these variables, quartz crystal 18 may be used as a bulk structure resonator from approximately 50 Khz to approximately 150 Mhz.

Cavity 27 is etched beneath the surface of a semiconducting substrate 12 so as to allow room for quartz crystal 18 to vibrate freely. Two areas of quartz crystal 18 are coated with a metal film to serve as electrodes (not shown). The electrodes on quartz crystal 18 are in turn bonded to semiconducting substrate 12 using a conductive attachment means 19 such as solder bumps or supports fabricated from a conductive epoxy material. Conductive attachment means 19 serve to hold quartz crystal 18 firmly in place while still allowing the desired mode of bulk structure vibration, providing the desired electrical connection, and providing the high degree of thermal coupling inherent in a monolithic device. Alternative embodiments of this invention use different positions for conductive attachment means 19 so as to provide support only at points which do not interfere with the desired mode of bulk structure vibration. Examples of these alternative embodiments include use of a single support pedestal surrounded by an annular cavity, and attaching quartz crystal 18 to the support pedestal. Some embodiments of this invention use a mode of bulk structure vibration which requires an electrical connection to the upper surface of quartz crystal 18, this can be accomplished by a means such as a wire joining the upper surface of quartz crystal 18 and a metallic bonding pad (not shown) on the top surface of semiconducting substrate 12.

Figure 3:
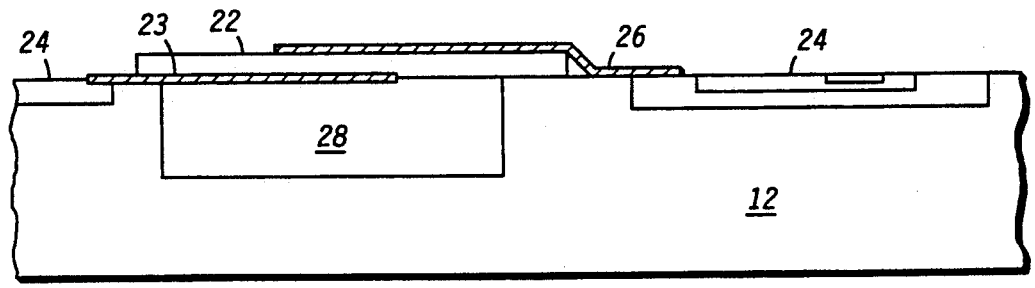
FIG. 3 shows a cross sectional view of an integrated circuit having a thin film non-conductive piezoelectric resonator as a third embodiment of the present invention.

FIG. 3 shows a cross sectional view of a portion of an integrated circuit having a thin film non-conductive piezoelectric resonator 22 as a third preferred embodiment of the present invention. Semiconducting substrate 12 is prepared with a plurality of integrated circuit components 24 and a cavity 28. Semiconducting substrate 12 is typically fabricated from a material such as silicon or a III-V compound such as gallium-arsenide. Cavity 28 is fabricated in a fashion similar to cavity 11 (FIG. 1) providing clearance for piezoelectric film 22 to vibrate without interference. The geometry and dimensions of cavity 28 are selected to suit the size and support requirements of the desired thin film non-conductive piezoelectric resonator. A first metal layer 23, piezoelectric film 22, and a second metal layer 26 are fabricated by deposition of thin layers of material over cavity 28 while it is filled with a non-silicon material such as a phosphorus silicate glass (PSG). The PSG is then removed by selective etching as before. Thus the bulk structure resonator comprising piezoelectric film 22 is provided on semiconducting substrate 12. First metal layer 23, and a second metal layer 26 are fabricated from one of the metals typically used in integrated circuit fabrication such as gold or the like. Piezoelectric film 22 is fabricated from a non-conductive piezoelectric material such as zinc oxide, aluminum nitride or the like. First metal layer 23 is electrically coupled to a lower surface of piezoelectric film 22. A top surface of piezoelectric film 22 is electrically coupled to second metal layer 26. An electric charge derived from the circuitry formed by integrated circuit components 24 is applied between electrodes comprising metal layers 23 and 26 inducing a vibration in piezoelectric film 22. This vibration has a distinct resonance frequency and hence is useful as a thin film non-conductive piezoelectric resonator for frequencies ranging from approximately 300 Mhz to approximately 900 Mhz. Alternative embodiments of this invention use a mode of vibration which involves the entire bulk structure of piezoelectric film 22, and embodiments using modes of vibration which comprise a surface acoustic wave (SAW). The exact dimensions and geometry of metal layers 23 and 26 as well as piezoelectric film 22 is selected to give the desired resonant frequency by methods well known in the art. Alternative embodiments include use of a single support pedestal surrounded by an annular cavity, and attaching piezoelectric film 22 to the single support pedestal.

By now it should be clear that monolithic integration of a bulk structure resonator with an integrated circuit provides numerous benefits. This integration allows the generation of a stable frequency source as part of a monolithic integrated circuit with all of the attendant benefits of an integrated system compared to a discrete system: small size, low cost, high reliability, better spare parts logistics, and ease of closely matching the bulk structure resonator to the oscillator circuit for critical applications. Alternative embodiments incorporate the use of non-piezoelectric mechanical resonators, quartz crystal resonators and thin film non-conductive piezoelectric resonators. Each type of resonator is used for the range of frequencies to which it is suited, providing a family of monolithic bulk structure resonators capable of being used with integrated circuits having operating frequencies from a few hundred hertz to over 500 Mhz.

We claim:

1. A monolithic circuit with integrated bulk structure resonator, comprising:
   a semiconductor substrate;
   a plurality of integrated circuit components fabricated as part of the semiconductor substrate;
   a mass supported by a spring directly mounted on the semiconductor substrate;
   exciting means for applying a varying electrostatic force to the mass in such a way as to induce a mechanical vibration in the mass; and
   a cavity fabricated on the semiconducting substrate providing room for the mechanical vibration to occur.

2. The monolithic circuit with integrated bulk structure resonator of claim 1 wherein the semiconducting substrate material is silicon.

3. The monolithic circuit with integrated bulk structure resonator of claim 1 wherein the semiconducting substrate material is a III-IV compound semiconductor.

4. A monolithic circuit with integrated bulk structure resonator, comprising:
   a semiconducting substrate;
   a plurality of integrated circuit components fabricated on the semiconducting substrate;
   a plurality of integrated circuit components fabricated on the semiconducting substrate;

5. A monolithic circuit with integrated bulk structure resonator, comprising:
   a semiconducting substrate;
   a plurality of integrated circuit components fabricated on the semiconducting substrate;
   a quartz crystal resonator bonded to the semiconducting substrate by means of a plurality of solder bumps, wherein the solder bumps are sufficiently large to provide room between the quartz crystal resonator and the silicon substrate for a bulk structure vibration to occur within the quartz crystal resonator without interferance;
   means for applying electrical energy to the quartz crystal resonator in such a way as to piezoelectrically induce a bulk structure vibration in the quartz crystal resonator.

* * * * *

UNITED STATES PATENT AND TRADEMARK OFFICE
CERTIFICATE OF CORRECTION

PATENT NO. : 5,260,596
DATED : November 9, 1993
INVENTOR(S) : William C. Dunn, H. Ming Liau, Raymond M. Roop, and Ljubisa Ristic It is certified that error appears in the above-indentified patent and that said Letters Patent is hereby corrected as shown below:

In column 6, claim 4, line 25, please delete the words "a plurality of integrated circuit components fabricated on the semiconducting substrate;" and insert therefor:
  --a quartz crystal resonator bonded to the semiconducting a substrate by means of solder bumps;
means for applying electrical energy to the quartz crystal resonator; and
  a cavity fabricated on the semiconducting substrate providing clearance for the bulk structure vibration to occur.--

Signed and Sealed this

Twelfth Day of July, 1994

Attest:

BRUCE LEHMAN

Attesting Officer

Commissioner of Patents and Trademarks